US012804852B2

(12) United States Patent
Zimon et al.

(10) Patent No.: US 12,804,852 B2
(45) Date of Patent: Nov. 17, 2026

(54) MICROFLUID COOLING FOR NON-UNIFORM HEATMAP

(71) Applicant: International Business Machines Corporation, Armonk, NY (US)

(72) Inventors: Malgorzata Jadwiga Zimon, Warrington (GB); Fausto Martelli, Stockton Heath (GB)

(73) Assignee: International Business Machines Corporation, Armonk, NY (US)

( * ) Notice: Subject to any disclaimer, the term of this patent is extended or adjusted under 35 U.S.C. 154(b) by 436 days.

(21) Appl. No.: 18/336,071

(22) Filed: Jun. 16, 2023

(65) Prior Publication Data

US 2024/0422940 A1 Dec. 19, 2024

(51) Int. Cl.

| | |
|---|---|
| ***H05K 7/20*** | (2006.01) |
| ***F28F 13/16*** | (2006.01) |
| ***G06F 1/20*** | (2006.01) |

(52) U.S. Cl.

CPC ......... *H05K 7/20281* (2013.01); *F28F 13/16* (2013.01); *G06F 1/206* (2013.01)

(58) Field of Classification Search

CPC .. F28F 13/16; G06F 1/20; G06F 1/206; G06F 2200/201; H01L 23/34; H01L 23/473; H05K 7/20281

USPC .......................................................... 700/300

See application file for complete search history.

(56) References Cited

U.S. PATENT DOCUMENTS

| | | | | |
|---|---|---|---|---|
| 7,219,715 B2 * | 5/2007 | Popovich | H01L 23/473 165/80.4 |
| 8,358,296 B2 | 1/2013 | Anderson | |
| 8,755,948 B2 | 6/2014 | Bower, III | |
| 8,987,891 B2 * | 3/2015 | Di Stefano | F28F 3/00 257/714 |
| 9,886,533 B2 * | 2/2018 | Boys | G06F 17/10 |
| 2004/0112568 A1 * | 6/2004 | Liu | F28F 1/045 165/96 |
| 2009/0008064 A1 * | 1/2009 | Nicole | F28D 15/04 165/104.28 |
| 2011/0304987 A1 * | 12/2011 | Oprins | H01L 23/4735 361/699 |
| 2013/0118711 A1 | 5/2013 | Vafai | |
| 2021/0356180 A1 | 11/2021 | Miozza et al. | |

(Continued)

FOREIGN PATENT DOCUMENTS

CN 121195344 12/2025

OTHER PUBLICATIONS

Rafati et al., Application of nanofluids in computer cooling systems (heat transfer performance of nanofluids), Applied Thermal Engineering 45-46 (2012) pp. 9-14. (Year: 2012).*

(Continued)

*Primary Examiner* — Chun Cao

(74) *Attorney, Agent, or Firm* — Harrity & Harrity, LLP

(57) ABSTRACT

The present inventive concept provides for a method of microfluid cooling for a non-uniform heatmap. The method includes identifying a plurality of zones of a microelectronic device. A local temperature measurement is obtained for one or more zones of the plurality of zones of the microelectronic device. A voltage is applied to a microfluid in at least a portion of the one or more zones based on the obtained local temperature measurement.

23 Claims, 3 Drawing Sheets

(56) References Cited

U.S. PATENT DOCUMENTS

2022/0187033 A1 6/2022 Sankar
2022/0214730 A1* 7/2022 Navarro Alvarez ........................ H05K 7/20281

OTHER PUBLICATIONS

International Searching Authority, "Notification of Transmittal of the International Search Report and the Written Opinion of the International Searching Authority, or Declaration," Patent Cooperation Treaty, Sep. 6, 2024, 10 pages, International Application No. PCT/IB2024/054480.
Paik et al., "Adaptive Cooling of Integrated Circuits Using Digital Microfluidics", IEEE Transactions on Very Large Scale Integration (VLSI) Systems, vol. 16, Issue-4, Apr. 2008, pp. 432-443.
Alwaaly et al., "Liquid Cooling of Non-Uniform Heat flux of Chip Circuit by Submicrochannels", Proc. of the Intl. Conf. on Advances in Civil, Structural and Mechanical Engineering—CSM 2014, Mar. 25, 2017, 05 pages.
Azarkish et al., "Self-adaptive microvalve array for energy efficient fluidic cooling in microelectronic systems", Published in: 2017 16th IEEE Intersociety Conference on Thermal and Thermomechanical Phenomena in EleSystems (ITherm), May 30, 2017-Jun. 2, 2017, Orlando, FL, USA, DOI:10.1109/ITHERM.2017.7992531, 6 pages.
Barrau et al., "An experimental study of a new hybrid jet impingement / micro-channel cooling scheme", Applied Thermal Engineering, 2010, 30 (14-15), pp. 2058, 10.1016/.applthermaleng.2010.05.013, hal-00660113.
Borg et al., "Multiscale simulation of enhanced water flow in nanotubes of different materials", The University of Edinburgh, Mrs bulletin, vol. 42, pp. 294-299, DOI: 10.1557/mrs.2017.59, 7 pages.
Bradley-Shaw et al., "Molecular Dynamics Simulations of Glycerol Monooleate Confined between Mica Surfaces", The Univeristy of Edinburgh, Jul. 13, 2016, 40 pages, Digital Object Identifier (DOI): 10.1021/acs.langmuir.6b00091.
Cassone et al., "Ab initio spectroscopy of water under electric fields", Physical Chemistry Chemical Physics 21, No. 38 (2019): 21205-21212, Abstract Only, 4 pages.
Formanek et al., "Probing the network topology in network-forming materials the case of water", AIP Advances 10, 055205 (2020); doi: 10.1063/5.0005332, Submitted: Feb. 20, 2020, Accepted: Apr. 13, 2020, Published Online: May 4, 2020, 9 pages.
Holland et al., "Molecular dynamics pre-simulations for nanoscale computational fluid dynamics", Microfluid Nanofluid (2015) 18:461-474, DOI 10.1007/s10404-014-1443-6, Published online: Jun. 20, 2014.
Holt et al., "Fast Mass Transport Through Sub-2-Nanometer Carbon Nanotubes", May 19, 2006, vol. 312, Science Magazine, www.sciencemag.org, 5 pages, Downloaded from http://science.sciencemag.org/ on Sep. 12, 2016.
Leoni et al., "Nanoconfined Fluids: Uniqueness of Water Compared to Other Liquids", ACS Nano 2021, 15, 19864-19876, https://doi.org/10.1021/acsnano.1c07381.
Liu et al., "Simulated conduction rates of water through a (6, 6) carbon nanotube strongly depend on bulk properties of the model employed" The Journal of Chemical Physics, Research Article, May 10, 2016, 144, 184502 (2016), https://doi.org/10.1063/1.4948485, 10 pages.
Liu et al., "Simulations of water transport through carbon nanotubes: How different water models influence the conduction rate", The Journal of Chemical Physics, Research Article, Oct. 2, 2014, 141, 18C518 (2014), https://doi.org/10.1063/1.4896689, 8 pages.
Majumder et al., "Enhanced flow in carbon nanotubes", Nanoscale Hydrodynamics, Nature|vol. 438|Nov. 3, 2005, 2 pages.
Martelli et al., "Network Topology in Water Nanoconfined between Phospholipid Membranes", arXiv:2101.06151v1 [cond-mat.soft] Jan. 15, 2021, 26 pages.
Martelli, Fausto, "Topology and complexity of the hydrogen bond network in classical models of water", arXiv:2101.09160v1 [cond-mat.soft] Jan. 22, 2021, 13 pages.
Mendonca et al., "Diffusion behavior of water confined in deformed carbon nanotubes", Physica A 517 (2019) 491-498, Elsevier, Available online Nov. 23, 2018, https://doi.org/10.1016/j.physa.2018.11.042.
Nicholls et al., "Water transport through carbon nanotubes with defects", pp. 781-785 |, Accepted Dec. 29, 2011, Published online: Mar. 30, 2012, Abstract Only, 2 pages.
Ritos et al, "Hybrid molecular continuum simulations of water flow through carbon nanotube membranes of realistic thickness", Microfluid Nanofluid (2015) 19:997-1010, DOI 10.1007/s10404-015-1617-x, Published online Jul. 10, 2015, 14 pages.
Ritos et al., "Electric fields can control the transport of water in carbon nanotubes", Phil. Trans. R. Soc. A 374: 20150025, http://dx.doi.org/10.1098/rsta.2015.0025, Accepted Oct. 12, 2015, 19 pages.
Ritos et al., "Flow enhancement in nanotubes of different materials and lengths", The Journal of Chemical Physics, 140, 014702 (2014), https://doi.org/10.1063/1.4846300, Research Article, Jan. 2014, 7 pages.
Saitta et al., "Ab initio molecular dynamics study of dissociation of water under an electric field", arXiv:1204.1120v1 [cond-mat.soft] Apr. 5, 2012, 5 pages.
Sharma et al., "A novel method of energy efficient hotspot-targeted embedded liquid cooling for electronics: An experimental study", International Journal of Heat and Mass Transfer 88 (2015) 684-694, Accepted Apr. 16, 2015, 11 pages.
Torrie et al., "Structure and adsorption of water in nonuniform cylindrical nanopores", AIP the Journal of Chemical Physics, 133, 224703 (2010); doi: 10.1063/1.3505453, 7 pages.
Wei et al., "Wettability of graphite under 2D confinement", Elsevier, Carbon 198 (2022) 132-141, https://doi.org/10.1016/j.carbon.2022.07.019, Available online Jul. 12, 2022.
Colgate et al., "An investigation of electrowetting-based microactuation", Journal of vacuum science american institute of physics, Jul. 1, 1990, pp. 3625-3633, doi: https://doi.org/10.1116/1.576516.
Elgabarty et al., "Enhancement of the local asymmetry in the hydrogen bond network of liquid water by an ultrafast electric field pulse", Scientific Reports, Jul. 10, 2019, 8 pages, doi: https://doi.org/10.1038/s41598-019-46449-5.
European Patent Office, "EP Examination Report", Jun. 11, 2026, 8 pages, EP Application No 24726983.0.
Toledo et al., "Electrical field effects on dipole moment, structure and energetic of (H2O)n (2 ? n ? 15) cluster", Journal of Molecular Structure: Theochem, vol. 915, No. 1-3, Dec. 15, 2009, pp. 170-177, doi: https://doi.org/10.1016/j.theochem.2009.08.035.

* cited by examiner

MICROFLUID COOLING FOR NON-UNIFORM HEATMAP

BACKGROUND

Exemplary embodiments of the present inventive concept relate to microfluid cooling, and more particularly, to microfluid cooling for a non-uniform heatmap.

With an increased demand for system reliability and performance combined with the miniaturisation of microelectronic devices, consideration of thermal dissipation has become an increasingly crucial factor in the design of electronic packaging, from chips to a system level. A microprocessor is a microchip which is crucial in the field of microelectronics with billions of transistors per square centimetre, amplifying, controlling, and generating electrical signals. As semiconductor technology continues to scale down, the chip temperature increases rapidly due to the exponentially growing power consumption. The increasing degree of excess heat has directly led to high packaging and cooling costs, and threatens to significantly degrade the performance, life span, and reliability of future computing systems. The microfluidic design of a cooling system aims at meeting the following goals:

a.—reduction of the maximum surface temperature, b.—minimisation of the surface temperature nonuniformity, c.—more efficient use of the liquid pumping power.

Most studies suggest reducing the maximum surface temperature by using, e.g., microchannels, jet cooling, and micro-gaps. Some recent work discusses solutions to the temperature non-uniformity of the chip surface. One such solution endeavours to tackle it by using the hybrid jet impingement microchannels. Another concept for energy-efficient, hotspot-targeted embedded liquid cooling of multicore microprocessors has been proposed. The proposed microfluidic system consists of microchannels with varying sizes, to collaboratively regulate the distribution of flow in different regions of the chip. Another solution proposed uses temperature-regulated microvalves instead. Although there are several interesting approaches for the thermal management of microelectronic devices, most of them are appropriate for a specific thermal map, especially for steady-state conditions. Therefore, a more general and energy-efficient approach is needed.

SUMMARY

Exemplary embodiments of the present inventive concept relate to a method, a computer program product, and a system for microfluid cooling for a non-uniform heatmap.

According to an exemplary embodiment of the present inventive concept, a method of microfluid cooling for a non-uniform heatmap is provided. The method includes identifying a plurality of zones of a microelectronic device. A local temperature measurement is obtained for one or more zones of the plurality of zones of the microelectronic device. A voltage is applied to a microfluid in at least a portion of the one or more zones based on the obtained local temperature measurement. Thus, microfluid flow rate, and consequently thermal cooling, can be non-uniformly influenced in the one or more zones without changing an architecture of a microelectronic device.

According to an exemplary embodiment of the present inventive concept, a computer program product for microfluid cooling for a non-uniform heatmap is provided. The computer program product includes one or more computer-readable storage media and program instructions stored on the one or more non-transitory computer-readable storage media capable of performing a method. The method includes identifying a plurality of zones of a microelectronic device. A local temperature measurement is obtained for one or more zones of the plurality of zones of the microelectronic device. A voltage is applied to a microfluid in at least a portion of the one or more zones based on the obtained local temperature measurement. Thus, microfluid flow rate, and consequently thermal cooling, can be non-uniformly influenced in the one or more zones without changing an architecture of a microelectronic device.

According to an exemplary embodiment of the present inventive concept, a computer system is provided for microfluid cooling for a non-uniform heatmap. The computer system includes one or more computer processors, one or more computer-readable storage media, and program instructions stored on the one or more of the computer-readable storage media for execution by at least one of the one or more processors capable of performing a method. The method includes identifying a plurality of zones of a microelectronic device. A local temperature measurement is obtained for one or more zones of the plurality of zones of the microelectronic device. A voltage is applied to a microfluid in at least a portion of the one or more zones based on the obtained local temperature measurement. Thus, microfluid flow rate, and consequently thermal cooling, can be non-uniformly influenced in the one or more zones without changing an architecture of a microelectronic device.

In an embodiment of the present inventive concept, the applying of the voltage alters the intermolecular cohesion in the microfluid. Thus, microfluid flow rate, and consequently thermal cooling, can be non-uniformly influenced in the one or more zones without changing an architecture of a microelectronic device.

In an embodiment of the present inventive concept, the applying of the voltage induces a super diffusivity of the microfluid. Thus, microfluid flow rate, and consequently thermal cooling, can be non-uniformly influenced in the one or more zones without changing an architecture of a microelectronic device.

In an embodiment of the present inventive concept, the applying of the voltage alters an intermolecular dimensionality of the microfluid. Thus, microfluid flow rate, and consequently thermal cooling, can be non-uniformly influenced in the one or more zones without changing an architecture of a microelectronic device.

In an embodiment of the present inventive concept, the microfluid is water, wherein the applying of the voltage disrupts intermolecular hydrogen bonding in the water, and wherein a dimensionality prevalence of the water differs between the one or more zones and at least one other zone. Thus, microfluid flow rate, and consequently thermal cooling, can be non-uniformly influenced in the one or more zones without changing an architecture of a microelectronic device.

In an embodiment of the present inventive concept, the one or more zones include a plurality of electrodes for the applying of the voltage. Thus, microfluid flow rate, and consequently thermal cooling, can be non-uniformly influenced in the one or more zones without changing an architecture of a microelectronic device.

In an embodiment of the present inventive concept, the one or more zones include a plurality of electrodes oppositely disposed in pairs across a coolant channel for the applying of the voltage. Thus, microfluid flow rate, and consequently thermal cooling, can be non-uniformly influenced in the one or more zones without changing an architecture of a microelectronic device.

In an embodiment of the present inventive concept, the non-uniform heatmap is generated from the local obtained temperature measurement for the plurality of zones, and the applying of the voltage is different for at least two zones of the plurality of zones based on the non-uniform heatmap. Thus, microfluid flow rate, and consequently thermal cooling, can be non-uniformly influenced in the one or more zones without changing an architecture of a microelectronic device.

According to an exemplary embodiment of the present inventive concept, a method of microfluid cooling for a non-uniform heatmap is provided. The method includes disposing electrodes on protruding contacts of a microelectronic device at least partially defining a coolant channel for a microfluid. A plurality of local temperature measurements is obtained from temperature sensors disposed in different zones of the microelectronic device adjacent to corresponding segments of the coolant channel for the microfluid. A voltage is applied to the microfluid in the coolant channel using the disposed electrodes based on the obtained local temperature measurement. Thus, microfluid flow rate, and consequently thermal cooling, can be non-uniformly influenced in the one or more zones without changing an architecture of a microelectronic device.

In an embodiment of the present inventive concept, the protruding contacts of the microelectronic device are heat sources. Thus, microfluid flow rate, and consequently thermal cooling, can be non-uniformly influenced in the one or more zones without changing an architecture of a microelectronic device.

According to an exemplary embodiment of the present inventive concept, a method of microfluid cooling for a non-uniform heatmap is provided. The method includes inducing a transient change in a prevailing dimensionality of a microfluid within a coolant channel for a plurality of zones of a microelectronic device to increase a flow rate of the microfluid using an electric field. The induced transient change in the prevailing dimensionality of the microfluid varies between at least some zones of the plurality of zones. Thus, microfluid flow rate, and consequently thermal cooling, can be non-uniformly influenced in the one or more zones without changing an architecture of a microelectronic device.

In an embodiment of the present inventive concept, the induced transient change in a prevailing dimensionality of the microfluid is a two-dimensional hydrogen bond network. Thus, microfluid flow rate, and consequently thermal cooling, can be non-uniformly influenced in the one or more zones without changing an architecture of a microelectronic device.

BRIEF DESCRIPTION OF THE DRAWINGS

The following detailed description, given by way of example and not intended to limit the exemplary embodiments solely thereto, will best be appreciated in conjunction with the accompanying drawings, in which.

Figure 1:
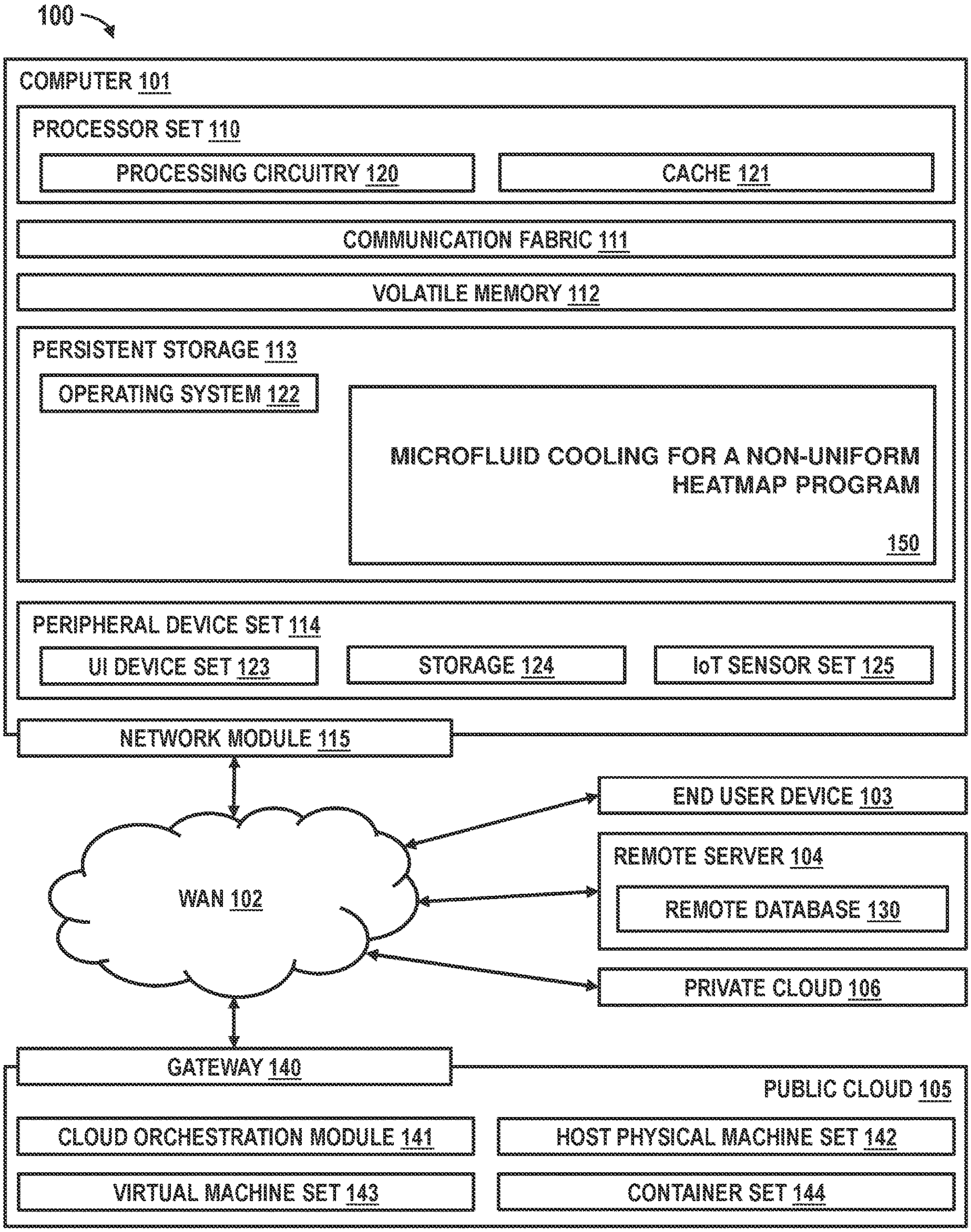
FIG. 1 illustrates a schematic diagram of computing environment 100 including a microfluid cooling for a non-uniform heatmap program 150, in accordance with an exemplary embodiment of the present inventive concept.

It is to be understood that the included drawings are not necessarily drawn to scale/proportion. The included drawings are merely schematic examples to assist in understanding of the present inventive concept and are not intended to portray fixed parameters. In the drawings, like numbering may represent like elements.

DETAILED DESCRIPTION

Exemplary embodiments of the present inventive concept are disclosed hereafter. However, it shall be understood that the scope of the present inventive concept is dictated by the claims. The disclosed exemplary embodiments are merely illustrative of the claimed system, method, and computer program product. The present inventive concept may be embodied in many different forms and should not be construed as limited to only the exemplary embodiments set forth herein. Rather, these included exemplary embodiments are provided for completeness of disclosure and to facilitate an understanding to those skilled in the art. In the detailed description, discussion of well-known features and techniques may be omitted to avoid unnecessarily obscuring the presented exemplary embodiments.

References in the specification to "one embodiment," "an embodiment," "an exemplary embodiment," etc., indicate that the embodiment described may include a particular feature, structure, or characteristic, but not every embodiment may necessarily include that feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether explicitly described.

In the interest of not obscuring the presentation of the exemplary embodiments of the present inventive concept, in the following detailed description, some processing steps or operations that are known in the art may have been combined for presentation and for illustration purposes, and in some instances, may have not been described in detail. Additionally, some processing steps or operations that are known in the art may not be described at all. The following detailed description is focused on the distinctive features or elements of the present inventive concept according to various exemplary embodiments.

The present inventive concept provides for a novel self-adaptive microfluidic method, computer program product, and system for the thermal management of microelectronic chips with a non-uniform thermal map. We use the fact that fluids under nanoscale confinement exhibit properties not observed in the bulk; water for example exhibits flow rates which exceed up to three orders of magnitude of the values predicted by the continuum hydrodynamic theory. Since the ability of water to absorb/release heat locally depends on how fast molecules diffuse, we propose a method, computer program product, and system that can regulate temperature locally by controlling the speed of diffusivity of a microfluid. Unlike existing technologies which modify the flow rates of a microfluid with the use of microvalves or channels of varying sizes, our solution does not endeavour to alter the architecture of microelectronic devices. We instead focus on a novel solution which induces a local change in topology and/or dimensionality formation, such as inducing two-dimensional (2D) hydrogen bond networks (HBNs) in water to regulate the distribution and/or diffusivity thereof, such as in the context of increasing cooling of a microelectronic device. It is to be understood that non-uniform control of microfluid diffusivity can be applied to various other small-scale systems and technologies that involve use of sufficiently narrow channels, for example, membrane separation technology (desalination) or drug delivery. In addition, the present inventive concept is not limited to inducing changes in microfluid diffusivity with voltage. Various means for effectuating changes in microfluid diffusivity and/or dimensionality can be additionally or alternatively used in conjunction with the present inventive concept.

FIG. 1 illustrates a schematic diagram of computing environment 100 including the microfluid cooling for a non-uniform heatmap program 150, in accordance with an exemplary embodiment of the present inventive concept.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as the microfluid cooling for a non-uniform heatmap program 150. In addition to block 150, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 150, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 150 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 150 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2:
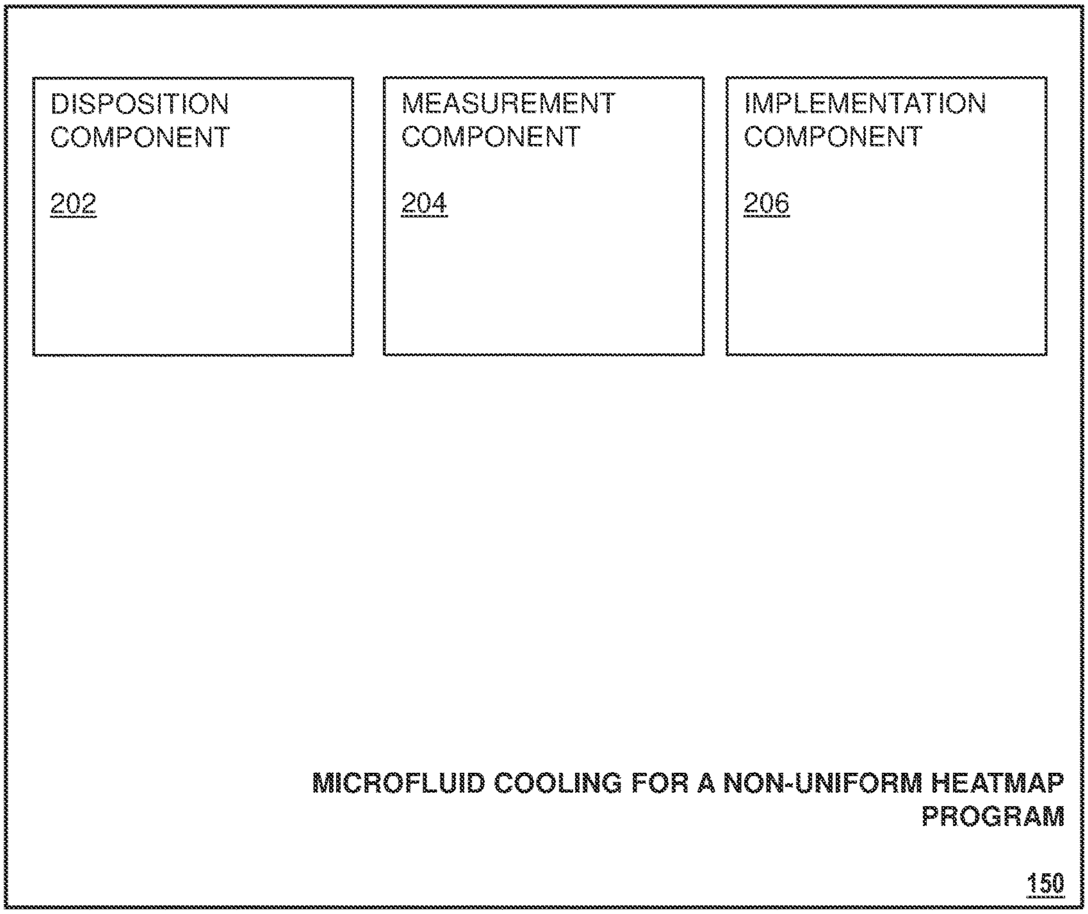
FIG. 2 illustrates a block diagram of components included in the microfluid cooling for a non-uniform heatmap program 150, in accordance with an exemplary embodiment of the present inventive concept.

FIG. 2 illustrates a block diagram of components included in the microfluid cooling for a non-uniform heatmap program 150, in accordance with an exemplary embodiment of the present inventive concept.

A disposition component 202 can identify a plurality of zones of a microelectronic device. At least some of the identified plurality of zones can overlap and/or can be symmetrical or asymmetrical. The plurality of zones can be selected arbitrarily, based on predetermined sizes (e.g., quadrants, regions, grid array units, etc.), predetermined areas (e.g., user input, manufacturer designation, heatmap densities, one or more locations and/or densities of one or more temperature sensors and/or disposed electrodes (e.g., pairs) for applying a voltage and/or an electric field to one or more microfluids (e.g., coolants (e.g., water), etc.), and/or based on an architecture of the microelectronic device (e.g., predetermined quantities, shapes, dimensions, locations, and/or densities of chips, temperature sensors, at least a portion of predictable heat sources (e.g., contacts), coolant channels and/or segments thereof, etc.).

The disposition component 202 can dispose the one or more electrodes and/or the temperature sensors or can instruct an implementation component 206 to do so in another step (referred to below in step 206). The disposition component 202 can determine one or more locations, arrays, and/or arrangements to dispose the one or more electrodes and/or the temperature sensors (e.g., based on predetermined intervals, the architecture of the microelectronic device and/or a sufficiency thereof, the one or more zones, optimized function efficiency, cost-benefit-analysis, etc.). For example, the optimal locations, quantities, and/or densities of the disposed electrodes can be based on resource cost minimization, cooling maximization, and/or areas of the one or more zones. The one or more temperature sensors can be disposed adjacent to or on the contacts (e.g., longitudinal contacts) and can overlap multiple zones, such as multiple zones defined by respective electrode pairs. At least some of the plurality of zones can include at least a segment of a coolant channel that one or more microfluid (e.g., water) can flow through. The coolant channel can be at least partially defined by contacts (e.g., horizontally protruding contacts and longitudinal contacts connected thereto). The contacts can be heat sources. The disposed electrodes can be situated on the contacts (e.g., the horizontally protruding contact). The electrodes can be disposed in pairs on opposite sides of at least a segment of the coolant channel (e.g., on adjacent horizontally protruding contacts).

The disposition component 202 can generate a schematic map including the one or more zones, the one or more locations and/or the densities of the one or more temperature sensors and/or disposed electrodes for applying the voltage and/or the electric field to the one or more microfluid, and/or the architecture of the microelectronic device (e.g., predetermined quantities, shapes, dimensions, and/or densities of chips, temperature sensors, predictable heat sources (e.g., contacts), coolant channels, etc.). The schematic map can be displayed on a user interface.

For example, the disposition component 202 can analyse the architecture of the microelectronic device, including the dimensions, shapes, and densities of contact heat sources and coolant channels for water. The disposition component 202 determines that the contact heat sources and the temperature sensors are regularly disposed. The disposition component 202 determines positions to oppositely dispose electrode pairs across adjacent horizontally protruding contacts of the coolant channel in a uniformly spaced arrangement. The disposition component 202 identifies the zones to correspond to virtually bounded rows of the electrode pairs which are overlapped at opposing horizontal sides by two different temperature sensors.

A measurement component 204 can obtain one or more local temperature measurements for at least a portion of the one or more zones of the microelectronic device. The obtained one or more local temperature measurements can correspond to temperatures of and/or adjacent to at least a portion of at least one contact heat source, the microfluid, and/or one or more segments of the coolant channel in the at least one or more zones. At least some of the one or more zones can include the one or more temperature sensors. The temperature sensors can overlap multiple zones and/or can be disposed on opposite sides thereof. The measurement component can interpolate or distinguish obtained one or more local temperature measurements for temperature sensors that overlap a same zone. The measurement component 204 can compare the obtained one or more local temperature measurements to predetermined temperature thresholds. The measurement component 204 can identify locations (e.g., zones, coolant channel segments, microelectronic device architecture, etc.), frequencies, times, and/or magnitudes of the obtained local temperature measurements that exceed the predetermined temperature thresholds, create a predictive model, and/or generate or update a heatmap accordingly. The heatmap can be overlay on the schematic map and can be displayed to the user.

For example, the measurement component 204 obtains local temperature measurements from the temperature sensors disposed in respective identified zones. The measurement component 204 compares the obtained local temperature measurements from the temperature sensors to predetermined temperature thresholds. The measurement component 204 identifies the zones which include first and third protruding contacts as exceeding the predetermined temperature thresholds. The measurement component 204 generates a heatmap and predictive model accordingly.

An implementation component 206 can apply a voltage and/or an electric field to the one or more microfluids in at least a portion of the one or more zones (e.g., one or more coolant channel segments) based on the one or more obtained local temperature measurements, the predictive model, and/or the generated heatmap. The implementation component 206 can select one or more microfluids to perform a predetermined function (e.g., cooling) and determine the adequacy thereof. A magnitude of the voltage and/or the electric field applied can be calculated based on at least one of a present microfluid temperature, microfluid chemical/physical attributes, a predetermined threshold of cooling in the one or more zones, and/or an amount necessary to change a prevailing dimensionality of intermolecular formations. The voltage and/or the electric field can be applied by the disposed electrodes (e.g., an electrode pair) in at least a portion of the one or more zones (e.g., one or more coolant channel segments and corresponding electrode pairs). The applied voltage and/or the electric field can change the prevailing dimensionality of intermolecular formations within the microfluid (e.g., from multi-dimensionality to two-dimensionality), such as by disrupting intermolecular affinities (e.g., hydrogen bonds). The change can induce a super diffusivity in the microfluid. Thus, a flow rate of the microfluid can be influenced (e.g., increased) in the one or more zones without modifying the architecture of the microelectronic device. The induced change can be transient and can differ between at least a portion of at least two zones. Thus, the change can be instantaneous and/or non-uniform. The implementation component 206 can dispose additional electrodes and/or temperature sensors based on the predictive model, the one or more obtained local temperature measurements, and/or the generated heatmap (e.g., to fix "blind spots" and/or increase cooling efficiency).

For example, the implementation component 206 selects water as a coolant. The implementation component 206 calculates voltage magnitudes necessary to disrupt hydrogen bonds and induce two-dimensionality intermolecular formations. The calculated voltage for zone 1 is greater than the calculated voltage for zone 3. The implementation component 206 uses the disposed electrode pairs throughout zones 1 and 3 to apply the respective calculated voltages to water when it reaches corresponding coolant channel segments.

Figure 3:
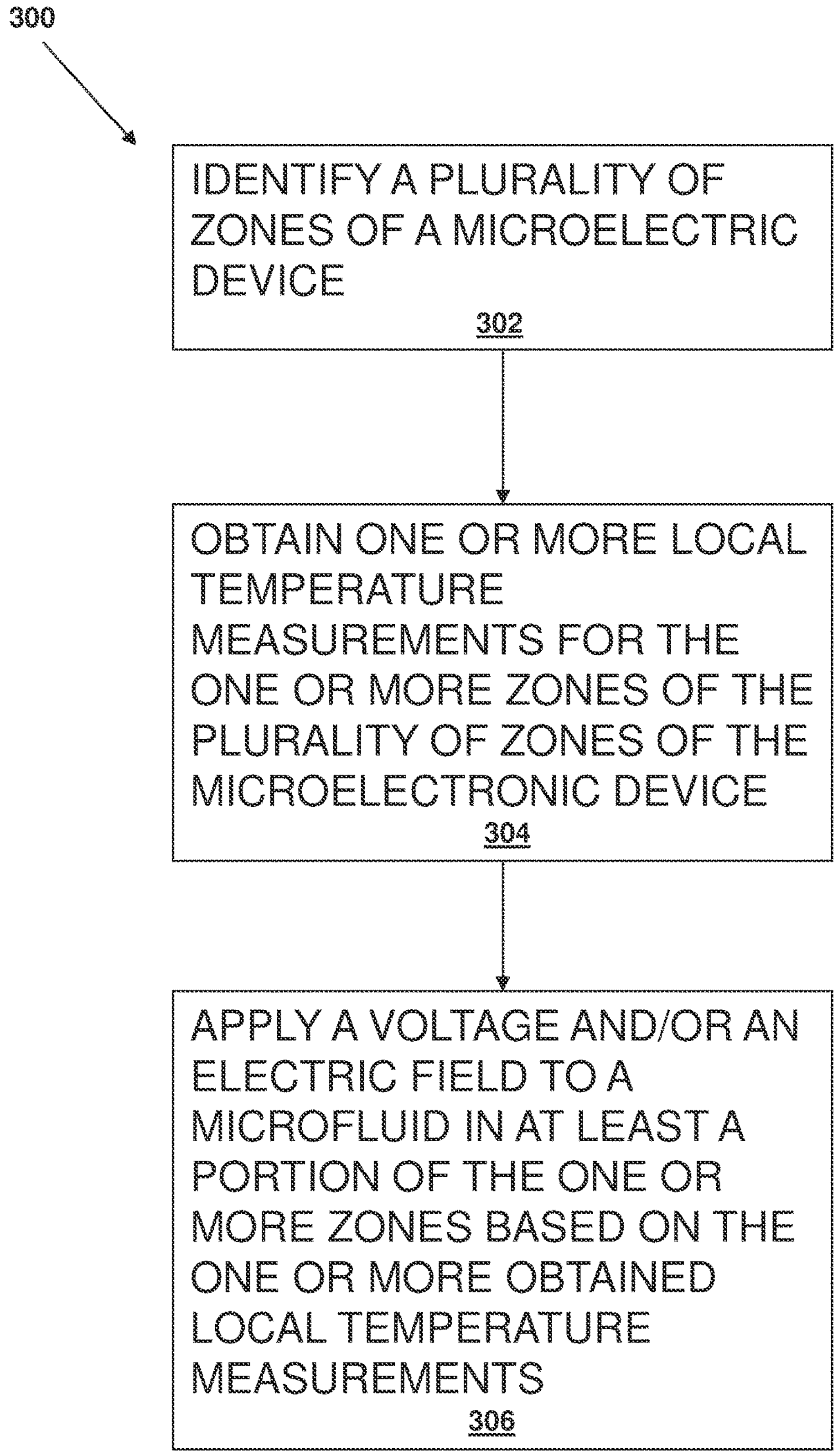
FIG. 3 illustrates a flowchart of a method of microfluid cooling for a non-uniform heatmap 300, in accordance with an exemplary embodiment of the present inventive concept.

FIG. 3 illustrates a flowchart of microfluid cooling for a non-uniform heatmap 300, in accordance with an exemplary embodiment of the present inventive concept.

The disposition component 202 can identify a plurality of zones of a microelectronic device (step 302).

The measurement component 204 can obtain a local temperature measurement for one or more zones of the plurality of zones of the microelectronic device (step 304).

The implementation component 206 can apply a voltage to a microfluid in at least a portion of the one or more zones based on the obtained local temperature measurement (step 306).

Based on the foregoing, a computer system, method, and computer program product have been disclosed. However, numerous modifications, additions, and substitutions can be made without deviating from the scope of the exemplary embodiments of the present inventive concept. Therefore, the exemplary embodiments of the present inventive concept have been disclosed by way of example and not by limitation.

What is claimed is:

1. A method of microfluid cooling for a non-uniform heatmap, the method comprising:
- identifying a plurality of zones of a microelectronic device comprising a coolant channel and pairs of electrodes respectively corresponding to the zones;
- obtaining local temperature measurements for the plurality of zones of the microelectronic device while a microfluid is flowing through the coolant channel;
- detecting, based on the local temperature measurements, a zone from the plurality of zones having a local temperature above a threshold temperature; and
- in response to the detecting, locally inducing super diffusivity of the microfluid by applying, via a pair of electrodes corresponding to the zone, a voltage to a segment of the coolant channel located in the zone while the microfluid is flowing through the segment.

2. The method of claim 1, wherein the applying of the voltage alters intermolecular cohesion in the microfluid.

3. The method of claim 1, further comprising calculating, based on the local temperature of the zone, a magnitude of the voltage necessary to induces the super diffusivity of the microfluid.

4. The method of claim 1, wherein the applying of the voltage alters an intermolecular dimensionality of the microfluid.

5. The method of claim 4, wherein the microfluid is water, wherein the applying of the voltage disrupts intermolecular hydrogen bonding in the water, and wherein a dimensionality prevalence of the water differs between the zones.

6. The method of claim 1, wherein the pairs of electrodes are oppositely disposed on horizontally protruding contacts of the coolant channel.

7. The method of claim 1, wherein the pairs of electrodes are oppositely disposed across respective segments of the coolant channel.

8. The method of claim 1, further comprising:
- detecting a second zone from the plurality of zones having a different local temperature above the threshold temperature;
- generating the non-uniform heatmap from the local obtained temperature measurements for the plurality of zones; and
- locally inducing super diffusivity of the microfluid in the second zone by applying, via a pair of electrodes corresponding to the second zone, a different voltage to a segment of the coolant channel located in the second zone based on the non-uniform heatmap.

9. A computer program product for microfluid cooling for a non-uniform heatmap comprising:

one or more computer-readable storage media and program instructions stored on the one or more computer-readable storage media capable of performing a method, the method comprising:

identifying a plurality of zones of a microelectronic device comprising a coolant channel and pairs of electrodes respectively corresponding to the zones;

obtaining local temperature measurements for the plurality of zones of the microelectronic device while a microfluid is flowing through the coolant channel;

detecting, based on the local temperature measurements, a zone from the plurality of zones having a local temperature above a threshold temperature; and in response to the detecting, locally inducing super diffusivity of the microfluid in the zone by applying, via a pair of electrodes corresponding to the zone, a voltage to a segment of the coolant channel located in the zone while the microfluid is flowing through the segment.

10. The computer program product of claim 9, wherein the applying of the voltage alters intermolecular cohesion in the microfluid.

11. The computer program product of claim 9, wherein the method further comprises calculating, based on the local temperature of the zone, a magnitude of the voltage necessary to induces the super diffusivity of the microfluid.

12. The computer program product of claim 9, wherein the applying of the voltage alters an intermolecular dimensionality of the microfluid.

13. The computer program product of claim 12, wherein the microfluid is water, wherein the applying of the voltage disrupts intermolecular hydrogen bonding in the water, and wherein a dimensionality prevalence of the water differs between the zones.

14. The computer program product of claim 9, wherein the pairs of electrodes are oppositely disposed on horizontally protruding contacts of the coolant channel.

15. The computer program product of claim 9, wherein the pairs of electrodes are oppositely disposed across respective segments of the coolant channel.

16. A computer system for microfluid cooling for a non-uniform heatmap, the computer system comprising:

one or more computer processors, one or more computer-readable storage media, and program instructions stored on the one or more of the computer-readable storage media for execution by at least one of the one or more processors capable of performing a method, the method comprising:

identifying a plurality of zones of a microelectronic device comprising a coolant channel and pairs of electrodes respectively corresponding to the zones;

obtaining local temperature measurements for the plurality of zones of the microelectronic device while a microfluid is flowing through the coolant channel;

detecting, based on the local temperature measurements, a zone from the plurality of zones having a local temperature above a threshold temperature; and in response to the detecting, locally inducing super diffusivity of the microfluid in the zone by applying, via a pair of electrodes corresponding to the zone, a voltage to a segment of the coolant channel located in the zone while the microfluid is flowing through the segment.

17. The computer system of claim 16, wherein the applying of the voltage alters intermolecular cohesion in the microfluid.

18. The computer system of claim 16, wherein the method further comprises calculating, based on the local temperature of the zone, a magnitude of the voltage necessary to induce a super diffusivity of the microfluid.

19. The computer system of claim 16, wherein the applying of the voltage alters an intermolecular dimensionality of the microfluid.

20. The computer system of claim 19, wherein the microfluid is water, wherein the applying of the voltage disrupts intermolecular hydrogen bonding in the water, and wherein a dimensionality prevalence of the water differs between the zones.

21. The computer system of claim 16, wherein the pairs of electrodes are oppositely disposed on horizontally protruding contacts of the coolant channel.

22. A method of microfluid cooling for a non-uniform heatmap, the method comprising:

disposing pairs of electrodes on respective pairs of protruding contacts of a microelectronic device at least partially defining a coolant channel for a microfluid, wherein the pairs of electrodes correspond to different zones of the microelectronic device;

obtaining, while a microfluid is flowing through the coolant channel, a plurality of local temperature measurements from temperature sensors disposed in the different zones of the microelectronic device adjacent to corresponding segments of the coolant channel for the microfluid located in the different zones;

detecting, based on the local temperature measurements, a zone from the different zones having a local temperature above a threshold temperature; and in response to the detecting, locally inducing super diffusivity of the microfluid in the zone by applying, via a pair of electrodes corresponding to the zone, a voltage to a segment of the coolant channel located in the zone while the microfluid is flowing through the segment.

23. The method of claim 22, wherein the protruding contacts of the microelectronic device are heat sources.

* * * * *